(12) United States Patent
Jung

(10) Patent No.: US 6,778,460 B1
(45) Date of Patent: Aug. 17, 2004

(54) SEMICONDUCTOR MEMORY DEVICE AND METHOD FOR GENERATION OF CORE VOLTAGE

(75) Inventor: Ho-Don Jung, Kyoungki-Do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/749,481

(22) Filed: Dec. 31, 2003

(30) Foreign Application Priority Data

Apr. 29, 2003 (TW) .............................. 10-2003-0027084

(51) Int. Cl.[7] ................................................ G11C 7/00
(52) U.S. Cl. ....................................... 365/227; 365/226
(58) Field of Search ............................... 365/205, 227, 365/208, 226, 201, 233, 189.09, 194

(56) References Cited

U.S. PATENT DOCUMENTS 6,233,605 B1 * 5/2001 Watson ....................... 709/204
6,385,119 B2 * 5/2002 Kobayashi et al. .......... 365/227
6,717,880 B2 * 4/2004 Jeong .......................... 365/227
2003/0179636 A1 * 9/2003 Choi et al. ................... 365/201

* cited by examiner

Primary Examiner—Brian Young
Assistant Examiner—John B Nguyen
(74) Attorney, Agent, or Firm—Blakely Sokoloff Taylor & Zafman LLP

(57) ABSTRACT

A semiconductor device, for use in a semiconductor memory device, for controlling a core voltage generator for providing a core voltage to be coupled to a bit line sensing amplifier, comprises a bit line sensing start signal controller for receiving a bit line sensing start signal to generate a delayed bit line sensing start control signal in response to a refresh signal; a core overdriving controller for generating an overdriving control signal in response to the delayed bit line sensing start signal; and a core voltage generator for generating the core voltage in response to the delayed bit line sensing start signal and the overdriving control signal to thereby provide core voltage to the bit line sensing amplifier after a predetermined delayed time from the bit line sensing start control signal.

15 Claims, 10 Drawing Sheets

SEMICONDUCTOR MEMORY DEVICE AND METHOD FOR GENERATION OF CORE VOLTAGE

FIELD OF INVENTION

The present invention relates to a semiconductor memory device; and, more particularly, to a semiconductor memory device and a core voltage generating method for stabilization of the core voltage during a refresh operation of the semiconductor memory device.

DESCRIPTION OF PRIOR ART

Generally, a semiconductor memory device is supplied with an external voltage VDD, and lowers a voltage level of the external voltage VDD to voltage levels of a core voltage VCORE and a peri voltage VPERI for operation of the semiconductor memory device; herein, the core voltage VCORE is used for reading data from a memory cell or writing data to the memory cell, and the peri voltage VPERI is used for operating internal circuits included in the semiconductor memory device.

Typically, in a conventional semiconductor memory device, a voltage level of the core voltage VCORE becomes unstable because excessive power consumption is occurred when a bit line is charged.

A core voltage generator raises the unstable core voltage VCORE to a stable voltage level. The core voltage generator determines whether or not the core voltage VCORE is stable by comparing the core voltage VCORE with a reference voltage VRC.

Herein, when the core voltage VCORE is unstable, an over driving controller is activated to drive the external voltage VDD over the core voltage VCORE.

RTOE and SBE are signals for the bit line charging. The conventional semiconductor memory device slows down activating speed of the RTOE and SBE to slow down power consuming speed of the core voltage VCORE during the bit line charging.

That is, the RTOE and SBE are activated to a logic 'LOW' level and to a logic 'HIGH' level respectively, and a predetermined time is needed to change levels of the RTOE and SBE. The semiconductor memory device extends the predetermined time so that the RTOE and SBE are activated slowly. Therefore, a voltage level of the core voltage VCORE is slowly downed.

FIG. 1 is a block diagram showing a power supply unit included in the conventional semiconductor memory device.

As shown, the conventional semiconductor memory device includes an over driving controller 11, a core voltage generator 10, a bit line sensing amplifier 12 and a bit line sensing amplifier controller 13.

The over driving controller 11 receives a bit line sensing start signal SEST30 and generates an over driving control signal SENSE_EN for driving an external voltage VDD over a core voltage VCORE. The core voltage generator 10 generates the core voltage VCORE for operating the bit line sensing amplifier 12 in response to the bit line sensing start signal SEST30 and the over driving control signal SENSE_EN.

The bit line sensing amplifier 12 amplifies a potential difference between a bit line pair BL and BLB. The bit line sensing amplifier controller 13 generates a first enable signal RTOE and a second enable signal SBE. Herein, the first enable signal RTOE and the second enable signal SBE are for enabling a first activating voltage RTO (not shown) and a second activating voltage SB (not shown) each, where the first activating voltage RTO and the second activating voltage SB are for operating the bit line sensing amplifier 12.

FIG. 2 is a circuit diagram showing the core voltage generator 10 shown in FIG. 1.

As shown, the core voltage generator 10 includes a control unit 101, a comparing unit 102, a core voltage comparing operator 103 and an over driving unit 104.

The control unit 101 turns on or off the comparing unit 102 depending on the bit line sensing start signal SEST30. The comparing unit 102 compares the reference voltage VRC with the core voltage VCORE to generate an enable signal COMP_EN depending on the comparison result. The over driving unit 104 generates the core voltage VCORE in response to the over driving control signal SENSE_EN.

The control unit 101 has an inverter I3, a PMOS transistor P1 and NMOS transistors N4 and N5.

Herein, the inverter I3 inverts the bit line sensing start signal SEST30. An output of the inverter I3 is connected to a gate of the PMOS transistor P1 and a source of the P1 is connected to an external voltage VDD. A gate of the NMOS transistor N4 is connected to the output of the inverter I3, a drain of the N4 is connected to a drain of the P1, a source of the N4 is connected to a ground voltage VSS. A drain and a gate of the NMOS transistor N5 are connected to the drain of the P1, a source of the N5 is connected to the ground voltage VSS.

The comparing unit 102 has PMOS transistors P2, P3, P4 and P5; and also has NMOS transistors N1, N2, N3, N6, N7, N8 and N9.

Herein, the P2 is paired with the P3 constituting a differential amplifying unit, and the P4 is paired with the P5 also constituting the differential amplifying unit. The N2 is controlled by the reference voltage VRC, and the N3 is controlled by the core voltage VCORE. The N2 and N3 are input units for the differential amplifying unit. The N7 severs as a current source for the differential amplifying unit. A gate of the N1 is connected to the reference voltage VRC and a source of the N1 is connected to a power voltage VDD. A gate of the N6 is connected to the gate of the N5. The N6 is connected between the drain of the N1 and the ground voltage VSS. A gate of the N8 is connected to the gate of the N7, and connected between the drain of the N9 and the ground voltage VSS.

Herein, the gate of the N3 is connected to the drain of the N9, and the gate of the N2 is connected to the drain of the N1.

A gate of the P6 included in the core voltage comparing operator 103 receives an enable signal COMP_EN. A source of the P6 is connected to the power voltage VDD and a drain of the P6 is connected to a gate of the N9.

A gate of the P7 included in the over driving unit 104 receives the sense enable signal SENSE_EN. A source of the P7 is connected to the power voltage VDD and a drain of the P7 is connected to the gate of the N9.

FIGS. 3A and 3B are circuit diagrams showing two different embodiments of the over driving controller 11. A first embodiment shown in FIG. 3A is provided with a plurality of inverters. Meanwhile, a second embodiment shown in FIG. 3B is provided with a plurality of PMOS capacitors.

As described above, the over driving controller 11 generates the over driving control signal SENSE_EN for driving the power voltage VDD over the core voltage VCORE after the conventional semiconductor memory device is activated.

Referring to FIG. 3A, the over driving controller 11 includes inverters I31 to I37 and a NAND gate NAND31.

The inverters I31 to I37 invert and delay a bit line sensing start signal SEST30. The NAND gate NAND31 receives the bit line sensing start signal SEST30 and an outputted signal from the inverters I31 to I37, and performs NAND operation on the two received signals, i.e., the bit line sensing start signal SEST30 and the outputted signal from the inverters I31 to I37.

Referring to FIG. 3B, the over driving controller 11 further includes inverters I38 to I43, a NAND gate NAND32, an NMOS transistor N31 and PMOS transistors P31 to P38.

FIGS. 4A and 4B are circuit diagrams showing the bit line sensing amplifier 12.

FIG. 4A shows a power supplying unit of the bit line sensing amplifier 12, and FIG. 4B shows an amplifying unit of the bit line sensing amplifier 12.

Referring to FIG. 4A, the power supplying unit of the bit line sensing amplifier 12 includes a first supplying unit 40 and a second supplying unit 41.

Herein, a first activating voltage RTO is supplied power by the core voltage VCORE or the power voltage VDD in response to first enable signal RTOE. A second activating voltage SB is supplied power by the ground voltage VSS in response to a second enable signal SBE.

The first supplying unit 40 is formed by a PMOS transistor P41; herein, a gate of the P41 is connected to the first enable signal RTOE, a source of the P41 is connected to the core voltage VCORE and outputs the first activating voltage RTO from a drain of the P41.

The second supplying unit 41 is formed by an NMOS transistor N41; herein, a gate of the N41 is connected to the second enable signal SBE, a source of the N41 is connected to the ground voltage VSS and outputs the second activating voltage SB from a drain of the N41.

Referring to FIG. 4B, the amplifying unit of the bit line sensing amplifier 12 includes cross-coupled four transistors N51, N52, P51 and P52.

FIG. 5 is a circuit diagram showing the bit line sensing amplifier controller 13 shown in FIG. 1.

As described above, the bit line sensing amplifier controller 13 receives the bit line sensing start signal SEST30 and the refresh signal REFB, and generates the first enable signal RTOE and the second enable signal SBE for enabling the first activating voltage RTO and the second activating voltage SB shown in FIGS. 4A and 4B.

As shown, the bit line sensing amplifier controller 13 is provided with inverters I51 to I54, PMOS transistors P51 to P54, NMOS transistors N51 to N54 and resistors R51 and R52.

The I51 and I52 are connected serially and delay the bit line sensing start signal SEST30 for a predetermined time. The delayed bit line sensing start signal SEST30 is inputted to a gate of the P51, and the P51 outputs the first enable signal RTOE through its drain.

A gate of the N51 is connected to the gate of the P51 and controlled by the bit line sensing start signal SEST30. Drains of the N52 and N53 are connected to a source of the N51 and their gates are connected to the power voltage VDD and the refresh signal REFB respectively.

The resistor R51 is serially connected to the N52 and the ground voltage. The I53 is for inverting the bit line sensing start signal SEST30.

The inverted bit line sensing start signal SEST30 is inputted to a gate of the P54 and controls the P54. The P54 outputs the second enable signal SBE from its drain. The N54 is controlled by the bit line sensing start signal SEST30 and its gate and source are connected to the gate of the P4 and the ground voltage VSS respectively.

One end of the resistor R52 is connected to the power voltage VDD, and the other end of the R52 is connected to the P52 and P53. The T54 inverts the refresh signal REFB. Gates of the P52 and P53 are connected to the power voltage VDD and the inverted refresh signal REFB respectively.

Referring to FIGS. 1 to 5, an operation of the power supply unit included in the conventional semiconductor memory device is described below.

If the power supply unit is activated, the bit line sensing start,signal SEST30 becomes a logic 'HIGH' level, and the core voltage generator 10, the over driving controller 11 and the bit line sensing amplifier are enabled or start to operate.

If the bit line sensing start signal SEST30 becomes a logic 'HIGH' level, the core voltage generator 10 enables the comparing unit 102 for comparing the reference voltage VRC with the core voltage VCORE.

Herein, if the core voltage VCORE becomes lower than the reference voltage VRC, the enable signal COMP_EN becomes a logic 'LOW' level and the PMOS transistor P6 is turned on driving the power voltage VDD over the core voltage VCORE. If the core voltage VCORE is higher than the reference voltage VRC, the COMP_EN becomes a logic 'HIGH' level and the PMOS transistor P6 is turned off separating the power voltage VDD from the core voltage VCORE.

The PMOS transistor P7 included in the over driving unit 104 controlled by the over driving control signal SENSE_EN to drive the power voltage VDD over the core voltage VCORE.

The over driving controller 11 generates the over driving control signal SENSE_EN if the bit line sensing start signal SEST30 becomes a logic 'HIGH' level. As described above, the over driving controller 11 can be embodied like a circuit shown in FIG. 3A or a circuit shown in FIG. 3B.

If the bit line sensing amplifier 12 is activated, the first enable signal RTOE generated from the bit line sensing amplifier 13 is enabled to turn on the PMOS transistor P41, and the first activating voltage RTO for operating the bit line sensing amplifier 12 is supplied with the core voltage VCORE.

At the same time, the second enable signal SBE is enabled to turn on the NMOS transistor N41, and the second activating voltage SB for operating the bit line sensing amplifier 12 is supplied power by the ground voltage VSS.

Therefore, the bit line sensing amplifier 12 consumes the first activating voltage RTO supplied with the core voltage VCORE for bit line charging. In the bit line sensing amplifier controller 13 shown in FIG. 5, if the bit line sensing start signal SEST30 becomes a logic 'HIGH' level, the first enable signal RTOE becomes a logic 'LOW' level and the second enable signal SBE becomes a logic 'HIGH' level.

Meanwhile, in the bit line sensing amplifier controller 13, the resistors R51 and R52 are included for controlling activating speed of the first enable signal RTOE and the second enable signal SBE so that the RTOE and the SBE can be activated slowly.

Therefore, the core voltage VCORE is merely lost during the refresh operation.

FIGS. 6 and 7 are timing diagrams showing variations of the core voltage VCORE during the normal operation shown in FIG. 6 and the refresh operation shown in FIG. 7 of the conventional semiconductor memory device.

As shown in FIG. 6, at the normal operation, the timing of driving the power voltage VDD over the core voltage VCORE is same as the timing of consuming the core voltage VCORE.

However, as shown in FIG. 7, at the refresh operation, the timing of driving the power voltage VDD over the core voltage VCORE is different from the timing of consuming the core voltage VCORE, whereby the core voltage VCORE rises excessively.

SUMMARY OF INVENTION

It is, therefore, an object of the present invention is to provide a semiconductor memory device for stabilizing a core voltage during a refresh operation.

In accordance with an aspect of the present invention, there is provided a core voltage control device including a bit line sensing start signal controller for receiving a bit line sensing start signal to generate a delayed bit line sensing start control signal in response to a refresh signal; a core overdriving controller for generating an overdriving control signal in response to the delayed bit line sensing start signal; and a core voltage generator for generating the core voltage in response to the delayed bit line sensing start signal and the overdriving control signal to thereby provide core voltage to the bit line sensing amplifier after a predetermined delayed time from the bit line sensing start control signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a power supply unit included in a semiconductor memory device in accordance with the present invention will be described in detail referring to the accompanying drawings.

Figure 1:
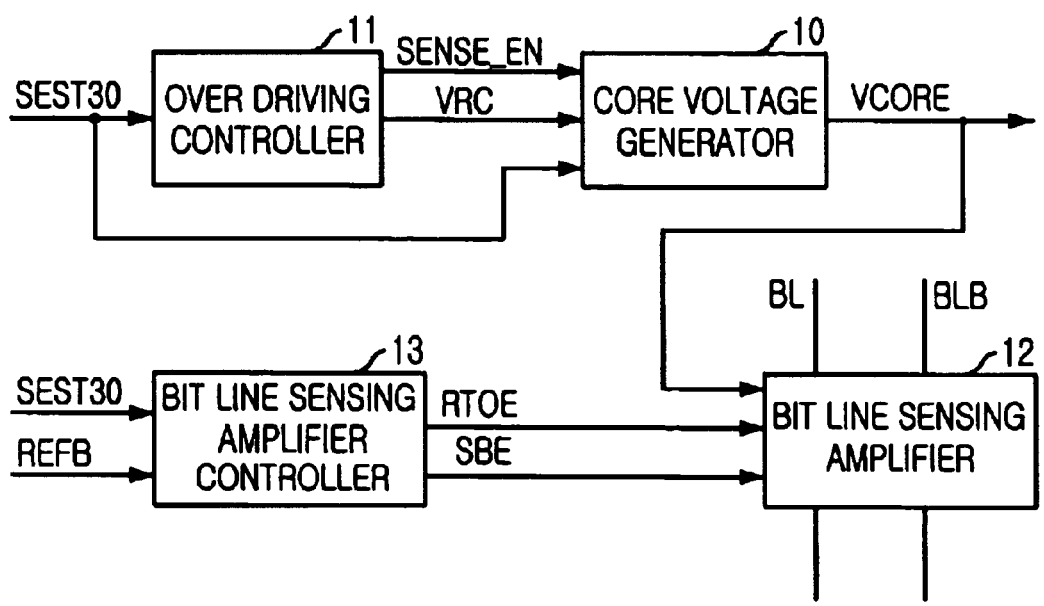
FIG. 1 is a block diagram showing a power supply unit included in a conventional semiconductor memory device.
Figure 2:
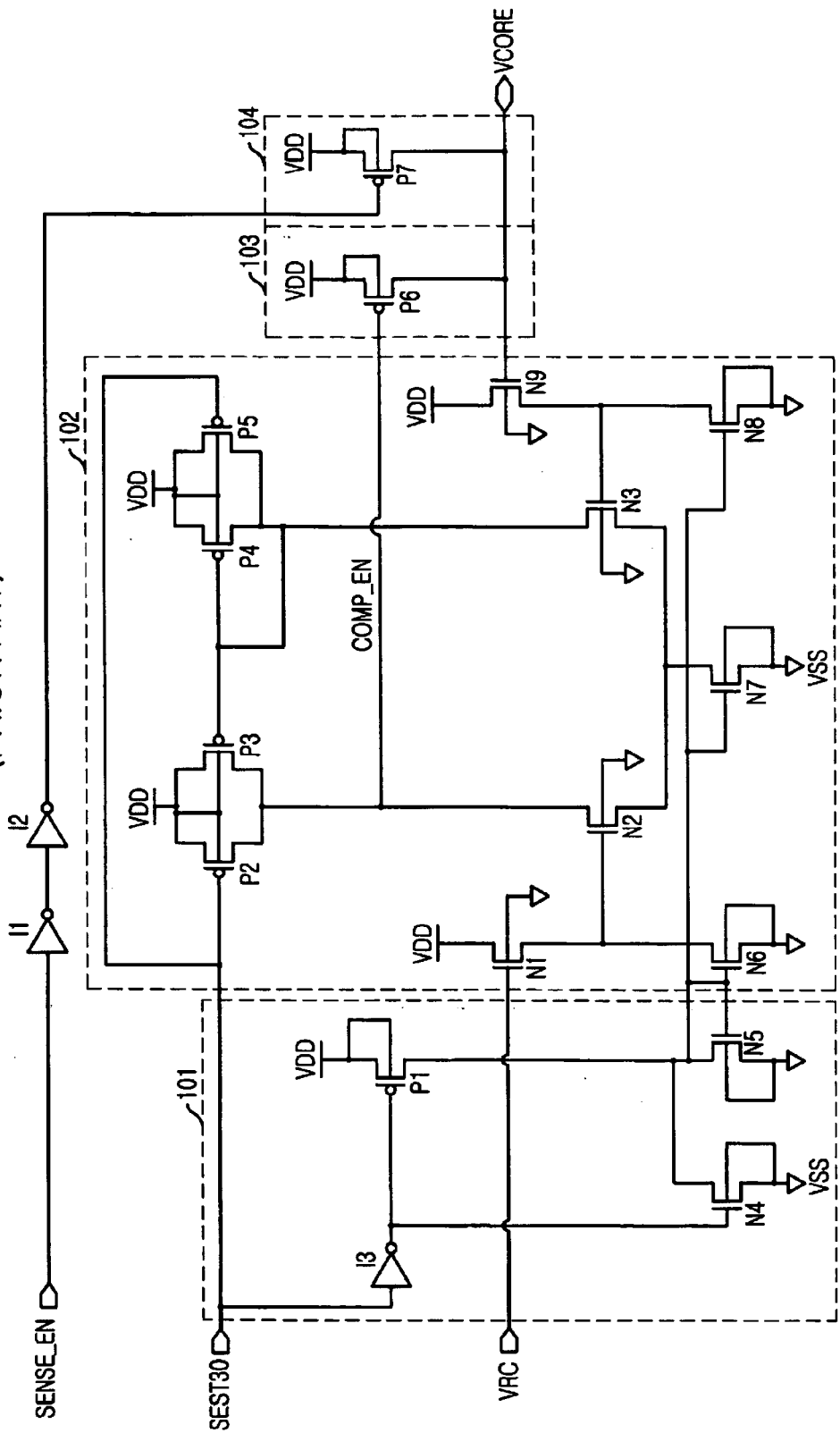
FIG. 2 is a circuit diagram showing a core voltage generator shown in FIG. 1.
Figure 3A:
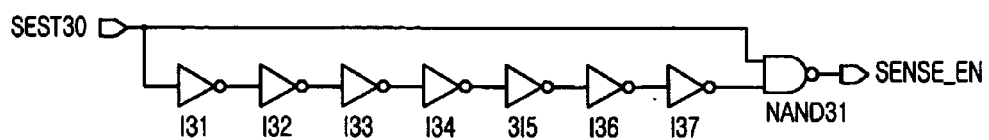
FIGS. 3A and 3B are circuit diagrams showing two different embodiments of an over driving controller shown in FIG. 1.
Figure 3B:
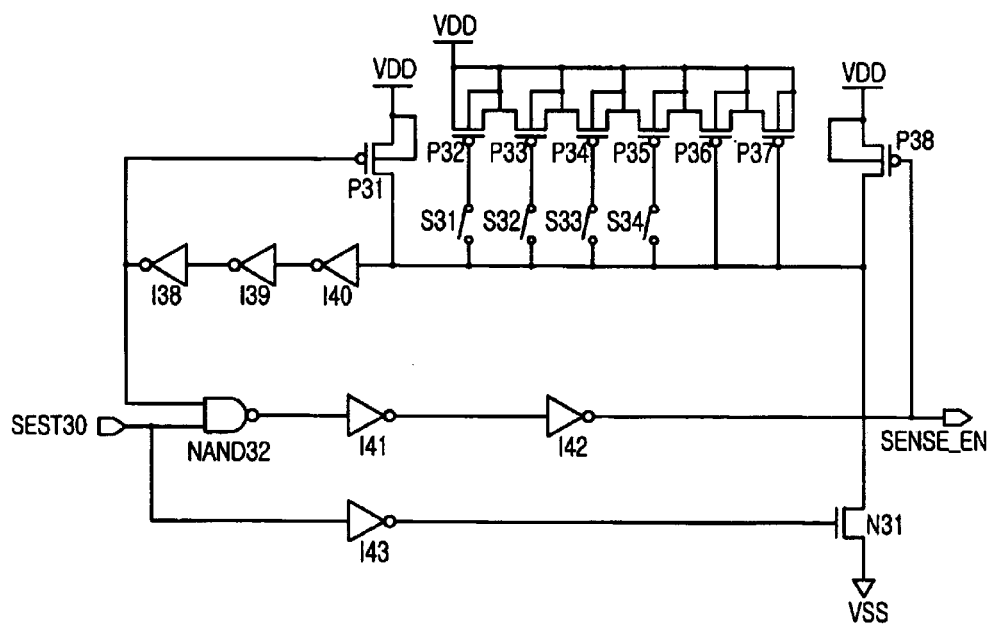
Figure 4A:
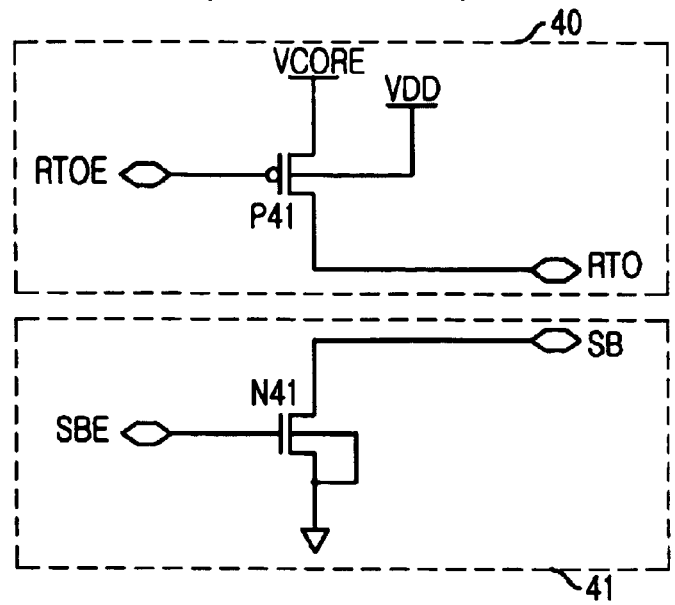
FIGS. 4A and 4B are circuit diagrams showing a bit line sensing amplifier shown in FIG. 1.
Figure 4B:
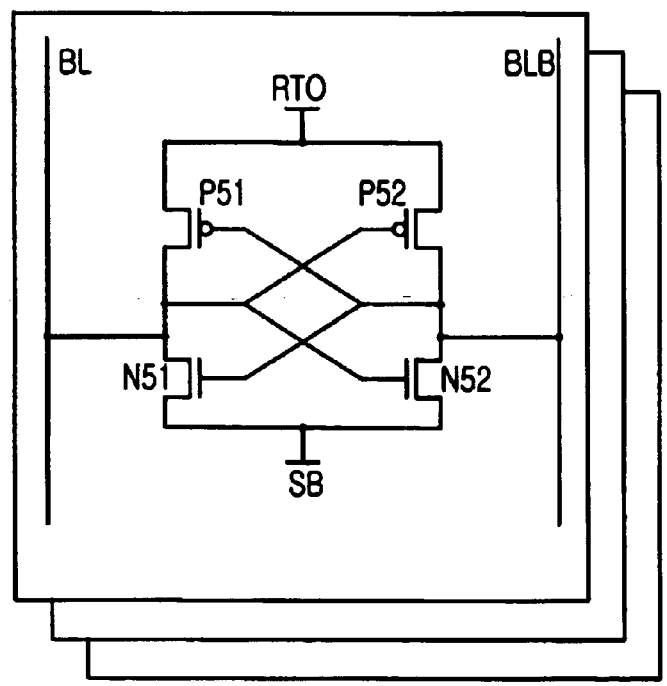
Figure 5:
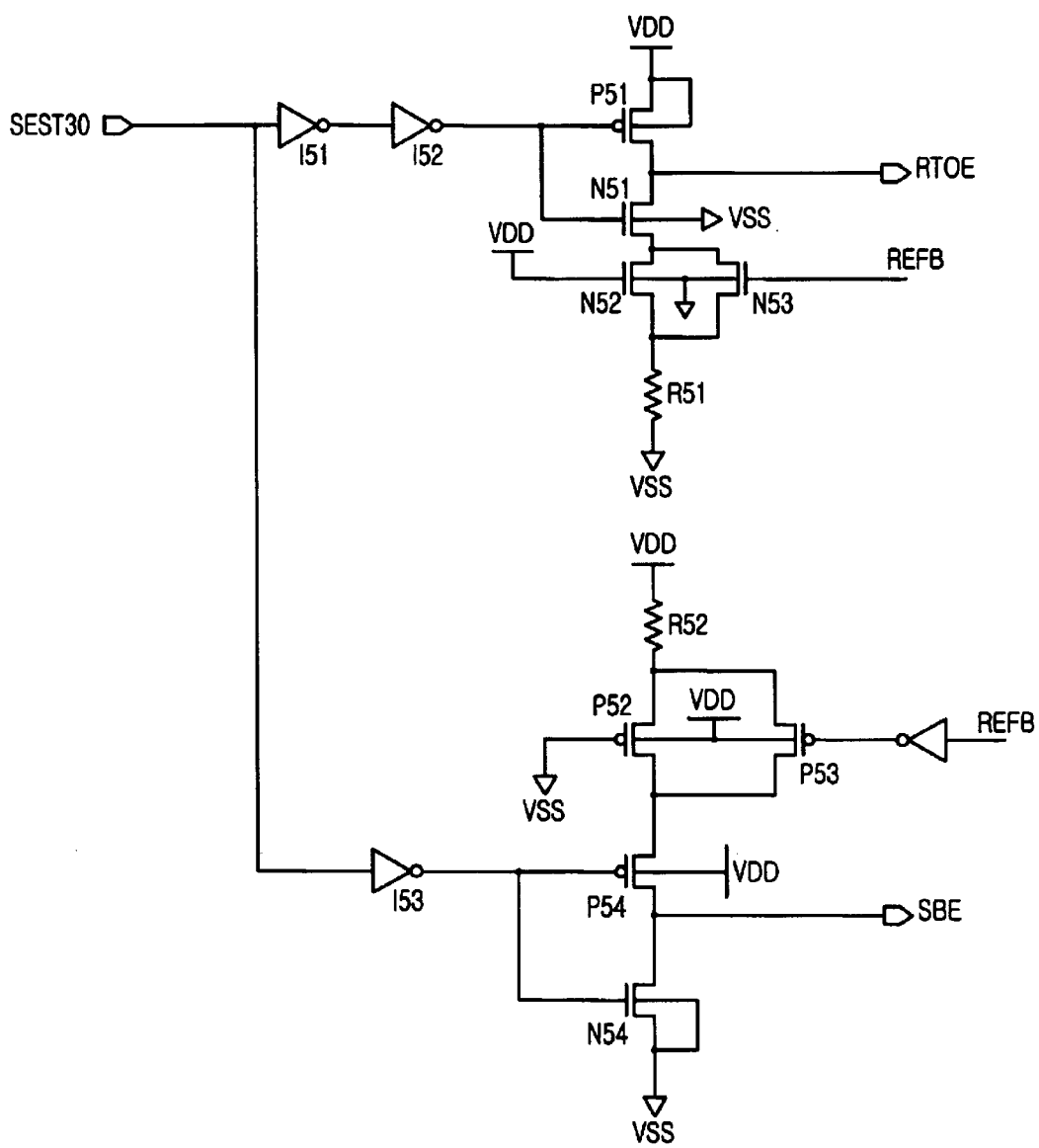
FIG. 5 is a circuit diagram showing a bit line sensing amplifier controller shown in FIG. 1.
Figure 6:
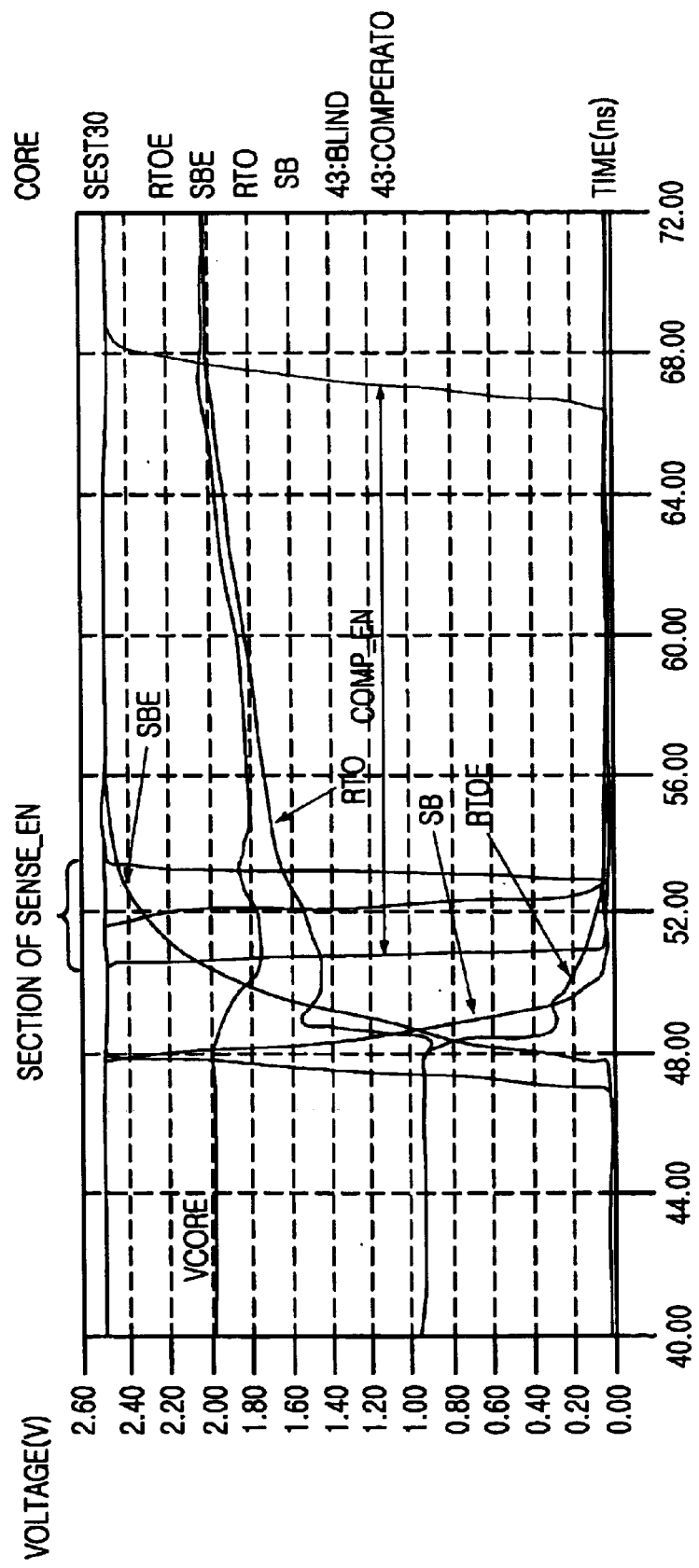
FIG. 6 is a timing diagram showing variations of a core voltage at a normal operation of the conventional semiconductor memory device.
Figure 7:
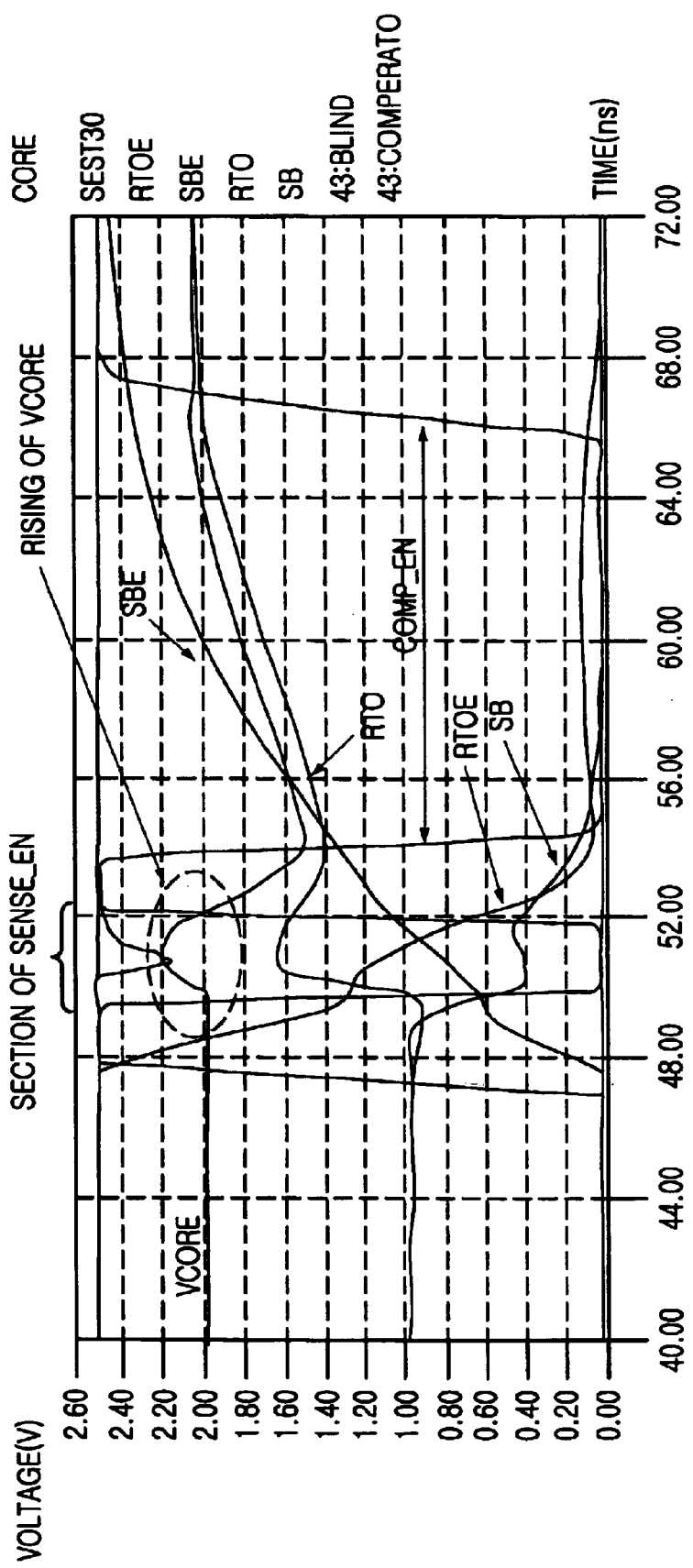
FIG. 7 is a timing diagram showing variations of a core voltage at a refresh operation of the conventional semiconductor memory device.
Figure 8:
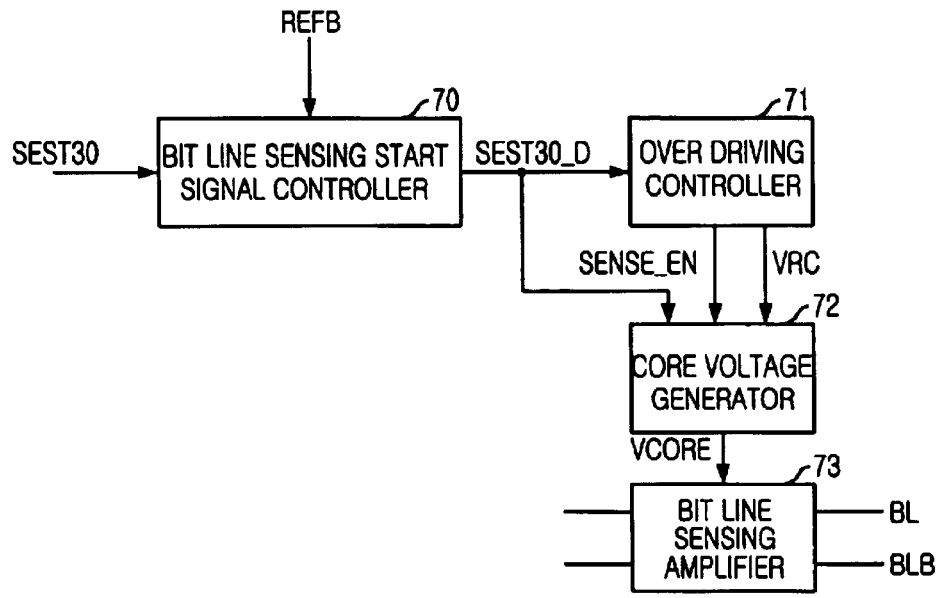
FIG. 8 is a block diagram showing a power supply unit included in a semiconductor memory device in accordance with the present invention.

FIG. 8 is a block diagram showing the power supply unit included in the semiconductor memory device in accordance with the present invention.

As shown, the power supply unit includes a bit line sensing start signal controller 70, an over driving controller 71, a core voltage generator 72 and a bit line sensing amplifier 73.

The bit line sensing start signal controller 70 is controlled by a refresh signal REFB and a bit line sensing start signal SEST30 to generate a second bit line sensing start signal SEST30_D.

The over driving controller 71 generates an over driving control signal SENSE_EN for driving a power voltage VDD over a core voltage VCORE.

The core voltage generator 72 receives the over driving control signal SENSE_EN, a reference voltage VRC and the second bit line sensing start signal SEST30_D to generate the core voltage VCORE. If a voltage level of the core voltage VCORE downs and unstable when a bit line is charged, the core voltage generator 72 raises the core voltage VCORE to a stable voltage level. The core voltage generator 72 determines whether or not the core voltage VCORE is stable by comparing the core voltage VCORE with the reference voltage VRC.

The bit line sensing amplifier 73 amplifies data on a bit line.

Although not shown in FIG. 8, there is also provided a bit line sensing amplifier controller for generating a first enable signal RTOE and a second enable signal SBE for supplying power to the bit line sensing amplifier 73.

Figure 9:
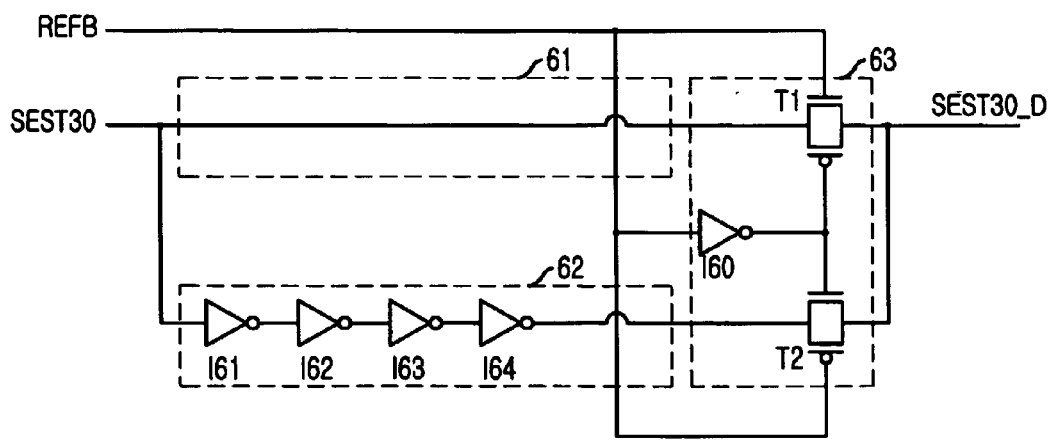
FIG. 9 is a circuit diagram showing a bit line sensing start signal controller included in the power supply unit shown in FIG. 8.

FIG. 9 is a circuit diagram showing the bit line sensing start signal controller 70 shown in FIG. B.

As shown, the bit line sensing start signal controller 70 includes a first block 61, a second block 62 and a selection unit 63. The bit line sensing start signal SEST30 is inputted through a first block 61 and a second block 62. The inputted bit line sensing start signal SEST30 is selected by the selection unit 63 to be outputted as the second bit line sensing start signal SEST30_D.

If the semiconductor memory device is operated in a normal mode, the first block 61 is selected by the selection unit 63 to output the bit line sensing start signal SEST30 as the second bit line sensing start signal SEST30_D through the first block 61. On the other hand, if the semiconductor memory device operates in a refresh mode, the second block 62 is selected by the selection unit 63 to output the bit line sensing start signal SEST30 as the second bit line sensing start signal SEST30_D through the second block 62.

The second block 62 includes inverters I61 to I64 to delays the bit line sensing start signal SEST30.

The selection unit 63 is controlled by the refresh signal REFB to select the first and second blocks 61 and 62.

Therefore, the second bit line sensing start signal SEST30_is outputted from the first block 61 without delaying the bit line sensing start signal SEST30 in the normal mode; and, the SEST30_is outputted from the second block 62 after delaying the SEST30 for a predetermined time by the inverters I61 to I64 in the refresh mode.

Figure 10A:
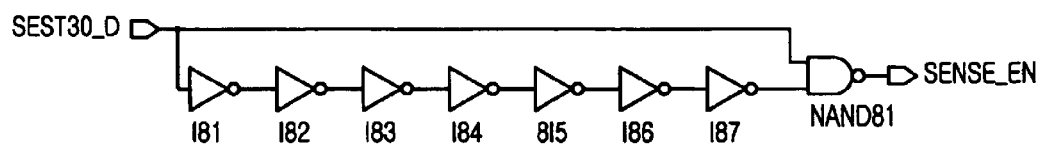
FIGS. 10A and 10B are circuit diagrams showing two different embodiments of an over driving controller shown in FIG. 8.
Figure 10B:
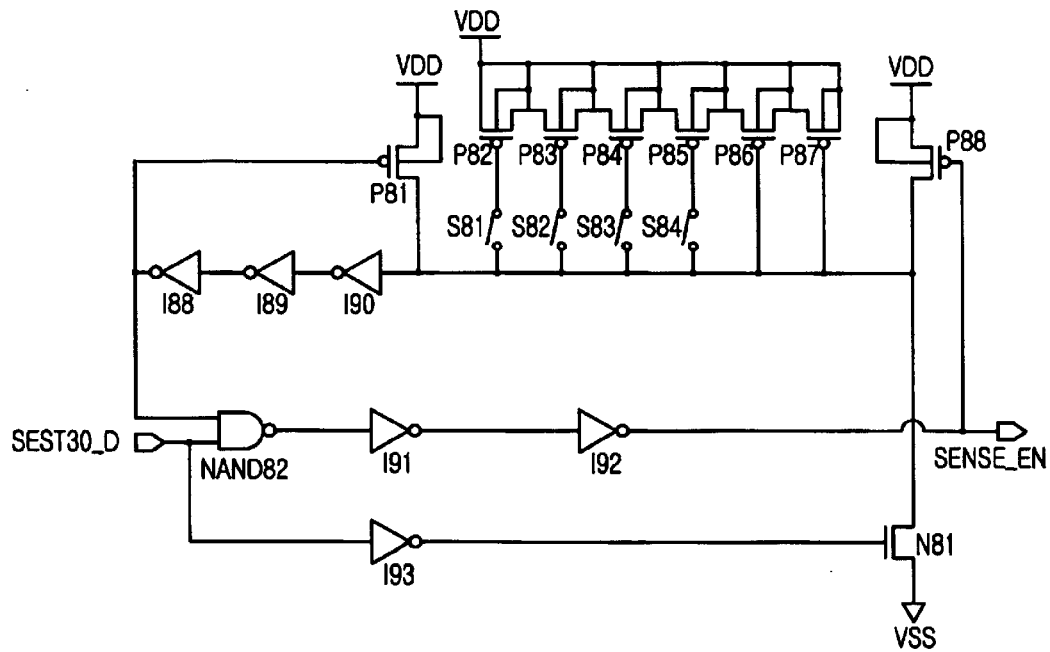

FIGS. 10A and 10B are circuit diagrams showing two different embodiments of the over driving controller 71. A first embodiment shown in FIG. 10A is provided with a plurality of inverters and a second embodiment shown in FIG. 10B is provided with a plurality of PMOS capacitors.

As described above, the over driving controller 71 generates the over driving control signal SENSE_EN for driving the power voltage VDD over the core voltage VCORE.

Referring to FIG. 10A, the over driving controller 71 includes inverters I81 to I87 and a NAND gate NAND81.

The inverters I31 to I37 invert and delay the bit line sensing start signal SEST30. The NAND gate NAND81 receives the bit line sensing start signal SEST30 and an outputted signal from the inverters I81 to I87, and performs NAND operation on the two received signals the bit line sensing start signal SEST30 and the outputted signal from the inverters I81 to I87.

Referring to FIG. 10B, the over driving controller 71 includes inverters I88 to I93, a NAND gate NAND82, an NMOS transistor N81 and PMOS transistors P81 to P88.

Figure 11:
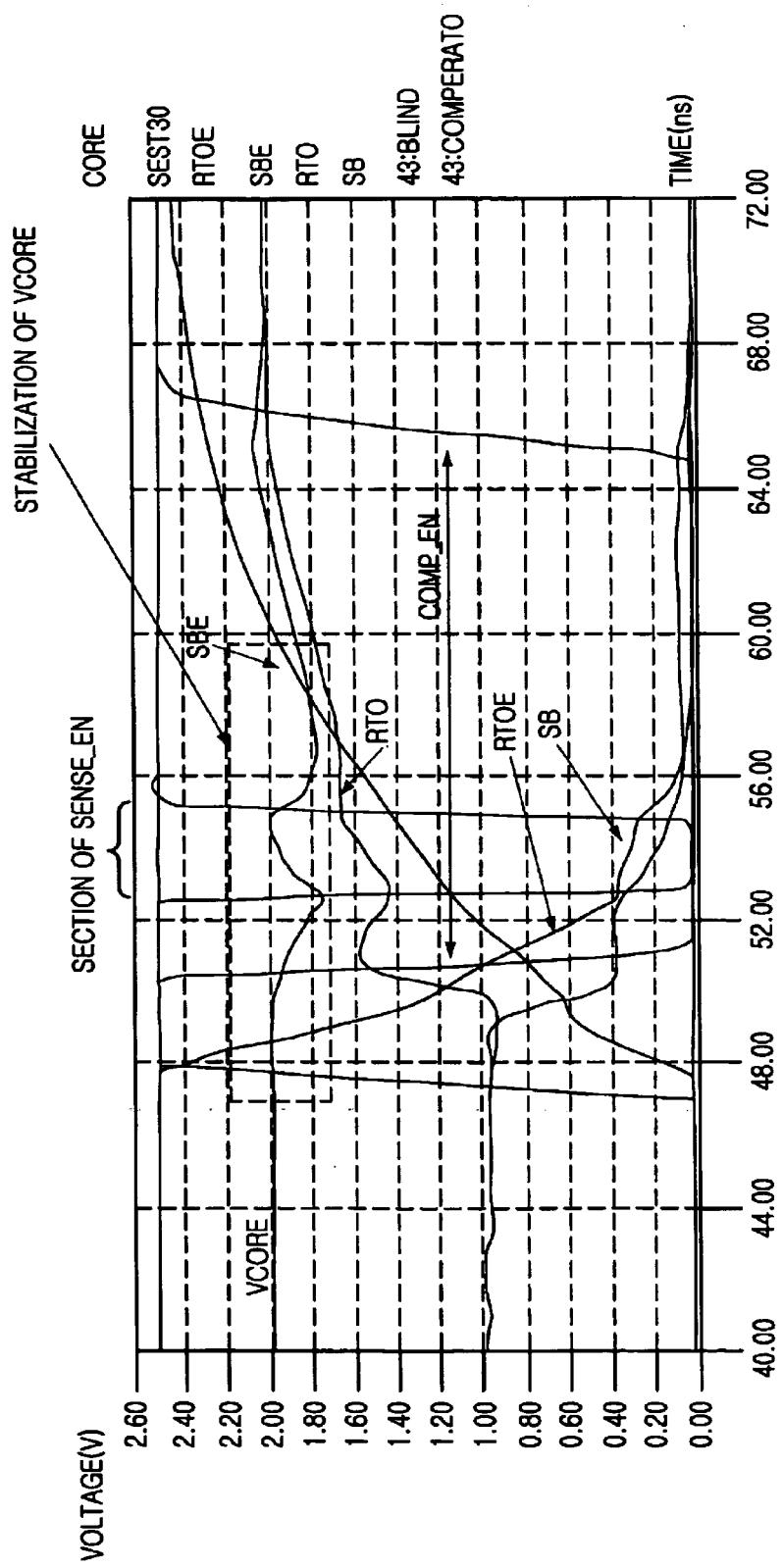
FIGS. 11 is a timing diagram showing variations of a core voltage at a refresh operation of the semiconductor memory device in accordance with the present invention.

FIG. 11 is a timing diagram showing variations of the core voltage VCORE during the refresh operation of the semiconductor memory device in accordance with the present invention.

Referring to FIGS. 8 to 11, operation of the present invention is described below.

As described above, the bit line sensing start signal SEST30 is outputted through the first block 61 or the second block 62 depending on the selection unit 63 controlled by the refresh signal REFB.

In the normal mode, the refresh signal REFB becomes a logic 'HIGH' level, whereby a transistor T1 is turned on so that the bit line sensing start signal SEST30 can be outputted through the first block 61.

In the refresh mode, the refresh signal REFB becomes a logic 'LOW' level, whereby a transistor T2 is turned on so that the bit line sensing start signal SEST30 can be outputted through the second block 62.

Therefore, since the SEST30 is delayed in the second block 62, the timing for driving the power voltage VDD over the core voltage VCORE is also delayed in the refresh mode.

As shown in FIG. 11, the core voltage VCORE is stabilized during the refresh operation. Because excessive power consuming time of the core voltage VCORE is delayed for a predetermined time in the refresh mode than that in the normal mode, the core voltage VCORE can be stabilized since the timing for driving the power voltage VDD over the core voltage VCORE is also delayed for the predetermined time in the refresh operation.

While the present invention has been described with respect to the particular embodiments, it will be apparent to those skilled in the art that various changes and modifications may be made without departing from the spirit and scope of the invention as defined in the following claims.

What is claimed is:

1. An apparatus, for use in a semiconductor memory device, for controlling a core voltage generator for providing a core voltage to be coupled to a bit line sensing amplifier, comprising:
    a bit line sensing start signal controller for receiving a bit line sensing start signal to generate a delayed bit line sensing start control signal in response to a refresh signal;
    a core overdriving controller for generating an overdriving control signal in response to the delayed bit line sensing start signal; and
    a core voltage generator for generating the core voltage in response to the delayed bit line sensing start signal and the overdriving control signal to thereby provide core voltage to the bit line sensing amplifier after a predetermined delayed time from the bit line sensing start control signal.

2. The apparatus as recited in claim 1, wherein the bit line sensing start signal controller includes:
    a first path for passing the bit line sensing start signal;
    a second path having a delay block for delaying the bit line sensing start signal for the predetermined delayed time to output the delayed bit line sensing start signal; and
    a selection block, in response to the refresh signal, for selectively outputting the delayed bit line sensing signal as an output signal.

3. The apparatus as recited in claim 2, wherein the selection block includes:
    a first transferring gate connected to the first path to be turned off in response to the refresh signal; and
    a second transferring gate connected to the second path to be turned on in response to the refresh signal.

4. The apparatus as recited in claim 3, wherein each of the first and the second transferring gates includes an NMOS transistor and a PMOS transistor.

5. The apparatus as recited in claim 2, wherein the second path includes an inverter chain for delaying the bit line sensing start signal for the predetermined delay time.

6. The apparatus as recited in claim 3, wherein the over driving controller includes a NAND gate and an inverter chain, wherein the output signal is coupled to one input of the NAND gate and the inverter chain, and the delayed output from the inverter is coupled to the other input of the NAND gate.

7. The apparatus as recited in claim 3, wherein the over driving controller includes a capacitor structure.

8. A method for generating a core voltage to be coupled to a bit line sensing amplifier for use in a semiconductor memory device, comprising a step of:
    delaying a bit line sensing start signal to generate the delayed bit line sensing start signal in response to a refresh signal;
    generating an overdriving control signal in response to the delayed bit line sensing start signal; and
    generating a core voltage in response to the delayed bit line sensing start signal and the over driving control signal to thereby provide the core voltage to the bit line sensing amplifier after a predetermined delayed time from the bit line sensing start control signal.

9. A semiconductor memory device, having a circuit for controlling a core voltage generator for providing a core voltage to be coupled to a bit line sensing amplifier, comprising:
    a bit line sensing start signal controller for receiving a bit line sensing start signal to generate a delayed bit line sensing start control signal in response to a refresh signal;
    a core overdriving controller for generating an overdriving control signal in response to the delayed bit line sensing start signal; and
    a core voltage generator for generating the core voltage in response to the delayed bit line sensing start signal and the overdriving control signal to thereby provide core voltage to the bit line sensing amplifier after a predetermined delayed time from the bit line sensing start control signal.

10. The semiconductor memory device as recited in claim 9, wherein the bit line sensing start signal controller includes:
    a first path for passing the bit line sensing start signal;
    a second path having a delay block for delaying the bit line sensing start signal for the predetermined delayed time to output the delayed bit line sensing start signal; and
    a selection block, in response to the refresh signal, for selectively outputting the delayed bit line sensing signal as an output signal.

11. The semiconductor memory device as recited in claim 10, wherein the selection block includes:
    a first transferring gate connected to the first path to be turned off in response to the refresh signal; and
    a second transferring gate connected to the second path to be turned on in response to the refresh signal.

12. The semiconductor memory device as recited in claim 11, wherein each of the first and the second transferring gates includes an NMOS transistor and a PMOS transistor.

13. The semiconductor memory device as recited in claim 10, wherein the second path includes an inverter chain for delaying the bit line sensing start signal for the predetermined delay time.

14. The semiconductor memory device as recited in claim 11, wherein the over driving controller includes a NAND gate and an inverter chain, wherein the output signal is coupled to one input of the NAND gate and the inverter chain, and the delayed output from the inverter is coupled to the other input of the NAND gate.

15. The apparatus as recited in claim 11, wherein the over driving controller includes a capacitor structure.

* * * * *